(12) United States Patent
Savich

(10) Patent No.: US 8,963,552 B2
(45) Date of Patent: Feb. 24, 2015

(54) ELECTROSTATIC DISCHARGE EVENT DETECTOR

(75) Inventor: Siarhei V. Savich, Sun Plaza (SG)

(73) Assignee: 3M Innovative Properties Company, St. Paul, MN (US)

( * ) Notice: Subject to any disclaimer, the term of this patent is extended or adjusted under 35 U.S.C. 154(b) by 168 days.

(21) Appl. No.: 13/456,367

(22) Filed: Apr. 26, 2012

(65) Prior Publication Data

US 2013/0285668 A1 Oct. 31, 2013

(51) Int. Cl.
*G01R 29/12* (2006.01)

(52) U.S. Cl.
USPC ........... 324/457; 324/458; 324/678; 324/382; 324/459

(58) Field of Classification Search
CPC ...... G01R 29/12; G01R 29/24; G01R 31/001; G01R 31/088; G01R 31/083
USPC .................. 324/457, 338, 458, 459, 678, 681
See application file for complete search history.

(56) References Cited

U.S. PATENT DOCUMENTS

| | | | |
|---|---|---|---|
| 3,603,963 A * | 9/1971 | Ward | ............................... 367/68 |
| 3,604,933 A | 9/1971 | Cross | |
| 3,627,408 A | 12/1971 | Fergason | |
| 3,740,754 A | 6/1973 | Epis | |
| 3,745,412 A | 7/1973 | Ruff | |
| 3,868,172 A | 2/1975 | Li | |
| 3,945,715 A | 3/1976 | Drake | |
| 3,965,029 A | 6/1976 | Arora | |
| 4,053,875 A | 10/1977 | Kupersmit | |
| 4,106,107 A | 8/1978 | Goodman | |
| 4,134,119 A | 1/1979 | Sandoz | |
| 4,286,210 A | 8/1981 | Ignatjev | |
| 4,307,726 A | 12/1981 | Paulson | |
| 4,465,969 A | 8/1984 | Tada | |
| 4,492,857 A | 1/1985 | Averbuch | |
| 4,507,605 A | 3/1985 | Geisel | |
| 4,562,429 A | 12/1985 | Conway | |
| 4,564,880 A | 1/1986 | Christ | |
| 4,580,188 A | 4/1986 | Brown | |
| 4,595,292 A | 6/1986 | Amodeo | |

(Continued)

FOREIGN PATENT DOCUMENTS

| | | |
|---|---|---|
| JP | 5312865 | 11/1993 |
| JP | 08-000377 | 2/1996 |

(Continued)

OTHER PUBLICATIONS

Breakthrough in LCD Technology—Film May be Used to Determine Voltage, National Engineer, Mar. 1987, pp. 14-15.

(Continued)

*Primary Examiner* — Tung X Nguyen
*Assistant Examiner* — Son Le
(74) *Attorney, Agent, or Firm* — Robert S. Moshrefzadeh

(57) ABSTRACT

A device for detecting an electrostatic discharge event by an object, the device comprising: a receiver for forming a first capacitive coupling with the object and a second capacitive coupling with a ground; and a first discharge path for discharging the second capacitive coupling to the ground, such that an electrostatic discharge event by the object charges the second capacitive coupling by an amount in a first time interval $\Delta t_1$ that is substantially less than a second time interval $\Delta t_2$ that it takes for the second capacitive coupling to discharge by the same amount through the first discharge path.

30 Claims, 14 Drawing Sheets

(56) References Cited

U.S. PATENT DOCUMENTS

| | | |
|---|---|---|
| 4,631,473 A | 12/1986 | Honda |
| 4,649,374 A | 3/1987 | Hoigaard |
| 4,671,161 A | 6/1987 | Rommel |
| 4,671,618 A | 6/1987 | Wu |
| 4,673,255 A | 6/1987 | West |
| 4,688,900 A | 8/1987 | Doane |
| 4,714,915 A | 12/1987 | Hascal |
| 4,737,730 A | 4/1988 | Ishiwata et al. |
| 4,782,299 A | 11/1988 | Argentieri |
| 4,785,294 A | 11/1988 | Campbell |
| 4,792,667 A | 12/1988 | Chen |
| 4,818,072 A | 4/1989 | Mohebban |
| 4,825,152 A | 4/1989 | Bossard |
| 4,838,653 A | 6/1989 | Mohebban |
| 4,975,686 A | 12/1990 | Delcourt |
| 5,016,020 A | 5/1991 | Simpson |
| 5,057,965 A | 10/1991 | Wilson |
| 5,083,117 A | 1/1992 | Hoigaard |
| 5,315,255 A | 5/1994 | Bettinger |
| 5,359,319 A | 10/1994 | Campbell |
| 5,373,304 A | 12/1994 | Nolan |
| 5,401,212 A | 3/1995 | Marvell |
| 5,410,324 A | 4/1995 | Bolomey |
| 5,422,630 A | 6/1995 | Quinn |
| 5,423,072 A | 6/1995 | Iwashita |
| 5,444,866 A | 8/1995 | Cykiert |
| 5,461,369 A | 10/1995 | Campbell |
| 5,463,379 A | 10/1995 | Campbell |
| 5,469,369 A | 11/1995 | Rose-Pehrsson |
| 5,507,012 A | 4/1996 | Luxon |
| 5,581,274 A * | 12/1996 | Tagawa .................. 345/104 |
| 5,708,458 A | 1/1998 | Vrbanac |
| 5,719,502 A | 2/1998 | Verbiest |
| 5,773,974 A | 6/1998 | Kraz |
| 5,877,630 A | 3/1999 | Kraz |
| 5,903,220 A | 5/1999 | Jon |
| 5,923,160 A | 7/1999 | DeChiaro |
| 6,091,764 A | 7/2000 | Silk |
| 6,112,246 A | 8/2000 | Horbal |
| 6,144,341 A | 11/2000 | Kraz |
| 6,172,496 B1 | 1/2001 | Karins |
| 6,175,238 B1 | 1/2001 | Lin |
| 6,247,599 B1 | 6/2001 | Cheng |
| 6,282,441 B1 | 8/2001 | Raymond |
| 6,315,719 B1 | 11/2001 | Rode |
| 6,359,444 B1 | 3/2002 | Grimes |
| 6,440,178 B2 | 8/2002 | Berner |
| 6,466,036 B1 * | 10/2002 | Philipp .................. 324/678 |
| 6,518,574 B1 | 2/2003 | Castleman |
| 6,563,319 B1 | 5/2003 | Kraz |
| 6,614,235 B2 | 9/2003 | Kraz |
| 6,640,134 B2 | 10/2003 | Raymond |
| 6,647,309 B1 | 11/2003 | Bone |
| 6,657,596 B2 | 12/2003 | Djuknic |
| 6,693,432 B2 | 2/2004 | Kraz |
| 6,700,385 B2 | 3/2004 | Kraz |
| 6,762,607 B2 | 7/2004 | Kraz |
| 6,781,205 B1 | 8/2004 | Levit |
| 6,901,971 B2 | 6/2005 | Speasl |
| 6,930,612 B1 | 8/2005 | Kraz |
| 6,985,346 B2 | 1/2006 | Kraz |
| 7,038,279 B2 | 5/2006 | Kraz |
| 7,085,120 B2 | 8/2006 | Kraz |
| 7,135,852 B2 | 11/2006 | Renken |
| 7,149,643 B2 | 12/2006 | Renken |
| 7,151,366 B2 | 12/2006 | Renken |
| 7,353,120 B2 | 4/2008 | Enta |
| 7,522,402 B2 | 4/2009 | Kraz |
| 7,525,316 B2 | 4/2009 | Kraz |
| 7,795,875 B2 | 9/2010 | Kraz |
| 2002/0187025 A1 | 12/2002 | Speasl |
| 2003/0048107 A1 | 3/2003 | Kraz |
| 2003/0052691 A1 | 3/2003 | Kraz |
| 2003/0109951 A1 | 6/2003 | Hsiung |
| 2003/0201778 A1 * | 10/2003 | Kraz .................. 324/458 |
| 2004/0082083 A1 | 4/2004 | Kraz |
| 2004/0154417 A1 | 8/2004 | Renken |
| 2004/0169516 A1 | 9/2004 | Kraz |
| 2004/0203933 A1 | 10/2004 | Cheng |
| 2004/0225462 A1 | 11/2004 | Renken |
| 2005/0024287 A1 | 2/2005 | Jo |
| 2005/0246127 A1 | 11/2005 | Renken |
| 2005/0284535 A1 | 12/2005 | Speasl |
| 2006/0015503 A1 | 1/2006 | Simons |
| 2007/0001849 A1 | 1/2007 | Black |
| 2007/0046284 A1 | 3/2007 | Renken |
| 2008/0004904 A1 | 1/2008 | Tran |
| 2009/0051535 A1 | 2/2009 | Brenner |
| 2010/0005152 A1 | 1/2010 | Ramamurthy |

FOREIGN PATENT DOCUMENTS

| | | |
|---|---|---|
| JP | 2004-527899 | 9/2004 |
| JP | 2006-513583 | 4/2006 |
| KR | 10-1998-0069556 | 10/1998 |
| WO | WO 96/37786 | 11/1996 |
| WO | WO 02-056344 | 7/2002 |
| WO | WO 2007-030479 | 3/2007 |
| WO | WO 2010-027643 | 3/2010 |

OTHER PUBLICATIONS

"EnviroTracker™ Mobile ESD Recorder for Semiconductor Process," www.credencetech.com, Credence Technologies, Inc., 2 pages, 2004.

International Search Report for PCT/US2009/054112, mailed Mar. 24, 2010, 3 pages.

International Search Report for PCT/US2006/34609, mailed Feb. 21, 2007, 2 pages.

PCT International Search Report for PCT/US2012/04391 dated Feb. 1, 2013, 3 pages.

* cited by examiner

ELECTROSTATIC DISCHARGE EVENT DETECTOR

FIELD

The present invention relates to a system and method for detection, measurement and continuous monitoring of Electrostatic Discharge (ESD) events.

BACKGROUND

Existing non-contact ESD event detectors are primarily based on high frequency electromagnetic radiation, induced by the very fast charge transfer between two objects.

As an example, an ESD event detector from Credence Technologies (U.S. Pat. No. 6,563,319) creates relaxation oscillation signals in a ringing circuit resulting from an ESD event. Then the signals pass through the high frequency amplifier to an envelope detector. A DC Voltage on the detector output is then said to be proportional to ESD event amplitude. However other signals with appropriate spectra components could cause false detections. Also the DC Voltage on the detector output may strongly depend on the ESD rise time. Further the falling edge of the ESD event may also create ringing which interferes and may give an inaccurate output.

An ESD event detector from 3M (U.S. Pat. No. 7,525,316) uses analog to digital sampling and a microprocessor for digital signal processing to differentiate between ESD events and other signals such as Electromagnetic Interference (EMI). This device may not be able recognize multiple successive ESD events, because a relatively long sampling time is required to detect each ESD event. Also both sampling and digital signal processing require high power consumption. Thus it may not be easy to use a battery power supply using such a method.

The prior art also includes U.S. Pat. No. 5,315,255, U.S. Pat. No. 5,719,502, U.S. Pat. No. 5,903,220, and U.S. Pat. No. 6,563,319.

SUMMARY

In a first specific expression of the invention there is provided a device for detecting an electrostatic discharge event by an object, the device comprising:
  a receiver for forming a first capacitive coupling with the object and a second capacitive coupling with a ground; and
  a first discharge path for discharging the second capacitive coupling to the ground, such that an electrostatic discharge event by the object charges the second capacitive coupling by an amount in a first time interval $\Delta t_1$ that is substantially less than a second time interval $\Delta t_2$ that it takes for the second capacitive coupling to discharge by the same amount through the first discharge path.

$\Delta t_1$ may be less than $\Delta t_2$ by at least a factor of 10. Alternatively $\Delta t_1$ may be less than $\Delta t_2$ by at least a factor of 100. The device may further comprise a second discharge path for discharging the second capacitive coupling to the ground, the device being capable of choosing between the first and second discharge paths. A discharge time through the second path may be substantially less than a discharge time through the first path.

The device may further comprise a commutation device for switching between the first and second discharge paths. The device may further comprise a processor for controlling the switching of the commutation device. The device may further comprise a low pass filter for blocking radio frequency signals of the output voltage signal to produce a filtered voltage signal. The device may further comprise an amplifier arranged to match an output impedance of the receiver to an input impedance of the low pass filter.

The device may further comprise a peak detection circuit for outputting a peak voltage of the filtered voltage signal, the magnitude of the ESD event being determined based on the peak voltage. The processor may be arranged to switch from the first discharge path to the second discharge path after obtaining the peak voltage from the peak detection circuit.

The processor may be arranged to reset the peak detection circuit after obtaining the peak voltage. The peak detection circuit may include a positive peak detector and a negative peak detector. The device may further comprise an inverter for inverting the filtered voltage signal to produce an inverted output signal, and wherein the inverted output signal is received by the negative peak detector. The device may further comprise a pulse generation circuitry arranged to generate a triggering pulse based on the inverted output signal.

The processor may be operable between a low power standby mode and an active mode, and wherein the processor is arranged to switch from the low power standby mode to the active mode upon detection of the triggering pulse. The pulse generation circuitry may include an inverting differentiating amplifier for producing an amplified output signal which is proportional to a first derivative of the inverted output signal, the triggering pulse being generated based on the amplified output signal. The primary discharge path may include a resistor and the output voltage signal is arranged to discharge through the resistor.

In a second specific expression of the invention there is provided a method of detecting an electrostatic discharge event by an object, the method comprising:
  forming a first capacitive coupling between a receiver and the object, the receiver also forming a second capacitive coupling with a ground;
  charging the second capacitive coupling by an amount in a first time interval $\Delta t_1$ due to an electrostatic discharge event by the object; and
  discharging the second capacitive coupling by the same amount in a second time interval $\Delta t_2$ via a first discharge path to the ground, wherein the first time interval $\Delta t_1$ is substantially less than the time interval $\Delta t_2$.

The method may further comprise switching between the first discharge path and a second discharge path for discharging the second capacitive coupling to the ground. A discharge time through the second discharge path may be substantially less than a discharge time through the first discharge path. The method may further comprise controlling the switching from the first discharge path to the second discharge path by a processor. The method may further comprise filtering the output voltage signal to block radio frequency signals of the output voltage signal to produce a filtered voltage signal. The method may further comprise detecting a peak of the filtered voltage signal by a peak detection circuit, outputting a peak voltage of the filtered voltage signal, and determining the magnitude of the ESD event based on the peak voltage. The method may further comprise resetting the peak detection circuit after determining the magnitude of the ESD event. The detecting the peak of the filtered voltage signal may include detecting a positive peak or a negative peak of the filtered voltage signal.

The method may further comprise inverting the filtered voltage signal to produce an inverted output signal, and detecting the peak of the filtered voltage signal includes detecting a negative peak of the inverted output signal. The method may further comprise generating a triggering pulse based on the inverted output signal. The processor may be operable between a low power standby mode and an active mode, and the method comprises switching the processor from the low power standby mode to the active mode upon detection of the triggering pulse. The method may further comprise producing an amplified output signal which is proportional to a first derivative of the inverted output signal, and generating the triggering pulse based on the amplified output signal.

In a third specific expression of the invention there is provided an ESD event detector comprising
   a receiver for receiving electromagnetic emission generated by an object and for forming a first capacitive coupling with the object;
   a second capacitive coupling between the receiver and ground for creating a capacitive divider with the first capacitive coupling, the capacitive divider arranged to produce an output voltage signal across the second capacitive coupling as a function of a charge voltage of the electromagnetic emission, the output voltage signal being used to determine a magnitude of the ESD event;
a first discharge path arranged in parallel electrically with the second capacitive coupling to enable the second capacitive coupling to discharge; and
a commutation device for selectively switching between the first discharge path and a second discharge path which allows the second capacitive coupling to discharge faster than via the primary discharge path.

In a fourth specific expression of the invention there is provided a method of detecting an ESD event, the method comprising
   (i) receiving electromagnetic emission from an object by a receiver, the receiver forming a first capacitive coupling with the object;
   (ii) obtaining an output voltage signal across a second capacitive coupling as a function of a charge voltage of the electromagnetic emission, the second capacitive coupling creating a capacitive divider with the first capacitive coupling,
   (iii) determining a magnitude of the ESD event based on the output voltage signal;
   (iv) discharging the second capacitive coupling through a first discharge path arranged in parallel electrically with the second capacitive coupling; and
   (v) upon determining the magnitude, switching from the first discharge path to a second discharge path to allow the second capacitive coupling to discharge faster than via the primary discharge path.

In a fifth specific expression of the invention there is provided a method of detecting an ESD event comprising:
   discharging a probe prior to the ESD event, and
   measuring the peak DC voltage of the probe after the ESD event as an indication of the amplitude of the ESD event.

The method may further comprise low pass filtering the voltage of the probe. The discharging may include providing a resistor connected between the probe and ground. The resistor may be of a value to substantially discharge the probe between consecutive ESD events for example by several microseconds, while still allowing the probe to stay charged for long enough for the measuring to be completed. The discharging may include switching the probe directly to ground after the peak DC voltage has been measured.

One or more embodiments may have the advantage that:
   the measured change in electrostatic charge (or voltage) of the probe may be in direct proportion with the object electric potential difference before and after the ESD event;
   an ESD event may be distinguished from other noise spikes with non-ESD nature, because for example EMI may not substantially change the average probe electrostatic charge (or voltage);
   fast signal sampling and complex signal processing to identify ESD events may be avoided;
   the result may not depend from an object model (CDM, HBM or MM) or discharge spike pulsewidth and rise time;
   measurement errors, caused by RF wave reflection or interference may be eliminated;
   big power-consuming components for a high frequency front-end may be avoided;
   the device may be placed into a deep sleep mode and wake up just when ESD event happens;
   the device may be housed in a portable battery ultra low power system for continuous monitoring; and/or
   the device may be more compact.

BRIEF DESCRIPTION OF DRAWINGS

Embodiments of the invention will now be described with reference to the accompanying drawings, in which.

DETAILED DESCRIPTION OF THE INVENTION

Figure 8:
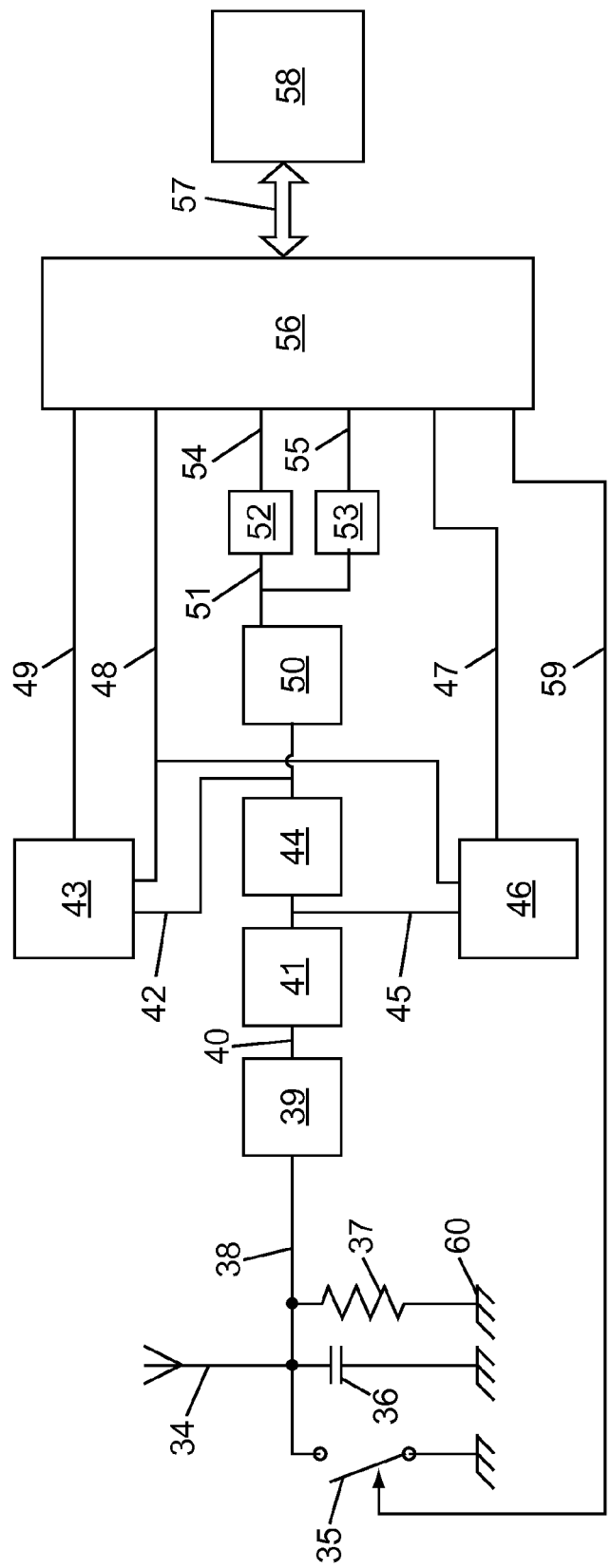
FIG. 8 is a block diagram of an ESD measuring and monitoring device according to the example embodiment.

An ESD detector is shown in FIG. 8 according to the example embodiment. The detector may be lower in power consumption, faster at detecting events and more accurate than the detector in U.S. Pat. No. 7,525,316. The detector includes a probe 34, a resistor 37 connected between the probe 34 and ground 60, a normally open switch 35 (or generally, a commutation device) connected between the probe 34 and ground 60, a Low-Pass filter (LPF) 41 filtering the probe 34 voltage, and Peak Voltage Detectors 43, 46 holding the peak output voltage of the Low-Pass filter 41.

As mentioned, when an ESD event occurs, an object near to the detector with a static charge of a certain voltage, discharges rapidly to ground. As a result the probe in the example embodiment initially becomes capacitively charged to a level in direct proportion to the original voltage of the object. So as a result the peak charge of the probe 34 can be measured to give a measure of the amplitude of the ESD event. Since EMI and other non ESD events will not significantly charge the probe 34, this measure may relatively accurately represent the amplitude of the ESD event.

The resistor 37 is provided to discharge the probe 34 in the steady state. This ensures that prior to the ESD event the probe 34 is at 0V, and not precharged which might lead to inaccurate results. Similarly the resistor 37 should not discharge the probe too quickly or it would not be possible to measure the amplitude of the ESD event. In addition, the value of the resistor 37 is arranged to be of a value small enough to provide full discharging between two ESD events which is at least of a couple of microseconds long.

The Low-Pass filter 41 is provided to remove the high frequency noise from the probe voltage, to allow measurement of the charge stored by the probe 34 from the ESD event.

The pair of Peak Voltage Detectors 43,46 are provided to obtain the peak output of the Low-Pass filter 41. Immediately after the ESD has transferred the maximum amount of charge to the probe 34, ideally the Low-Pass filter 41 should pass this value which is then detected and held by the Peak Voltage Detectors 43,46.

The switch 35 is provided to quickly discharge the probe 34 after the peak Low-Pass filter 41 voltage has been measured. Once the probe 34 has been discharged, it is possible to register the next ESD event. This allows for fast detection of multiple sequential ESD events.

Figure 1:
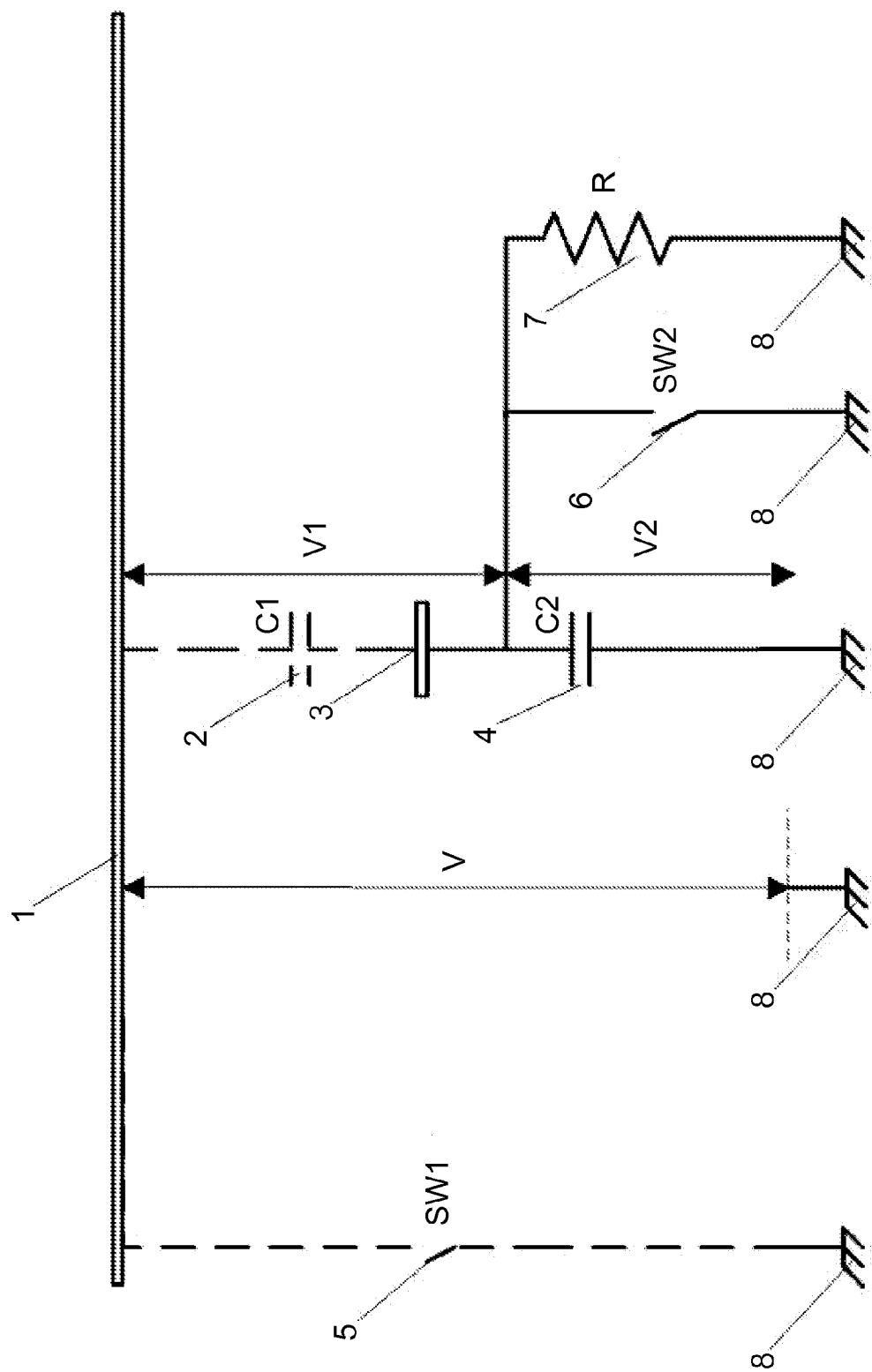
FIG. 1 is an equivalent circuit diagram model concept according to an embodiment of the present invention.

To explain the operation of the detector, a simplified equivalent circuit diagram is shown in FIG. 1. When a probe 3 is placed near an object 1, a virtual capacitor (C1) 2 is formed between the object 1 and the probe. A further virtual capacitor (C2) 4, which represents the common equivalent capacitance between the Probe 3 and the ground 8, is formed therebetween.

C2 4 is primarily associated with the capacitance of a shielded RF cable connected between the probe (antenna) 3 and the detector PCB. Alternatively the capacitance may be from the PCB, or from an added capacitor. It is to be appreciated that the added capacitance is included to specifically decrease the signal value in cases where ESD discharges of sufficiently high magnitude are encountered.

C1 2 and C2 4 represent a capacitive divider between the object 1 charge voltage V and the probe voltage. Virtual switch 5 (SW1) simulates the ESD, and when SW1 5 is closed, this simulates when the static discharge occurs between the object 1 touches the ground 8. Resistor 7 is provided for steady state discharge of C2 4. Switch 6 (SW2) quickly discharges C2 4 after ESD measurement is done.

If the object potential is V, C1 charge voltage is $$V1=V*C2/(C1+C2)$$

and C2 charge voltage is:

$$V2=V*C1/(C2+C1).$$

We assume that C1<<C2 and as a consequence assume V1≈V and V2<<V1. This is because C2 4 is relatively high due to the cable insulation and the close electrode spacing. C1 2 is small due to that large distance between object and probe and the low dielectric constant of air as the dielectric.

The resistor value R should be small enough to provide full discharge of C2 in several micro seconds but should not allow any significant discharge during the ESD which occurs over a couple tens of nano seconds. This does not influence V1 and its value follows V.

The device may be electrically grounded, even when hand held.

Figure 2:
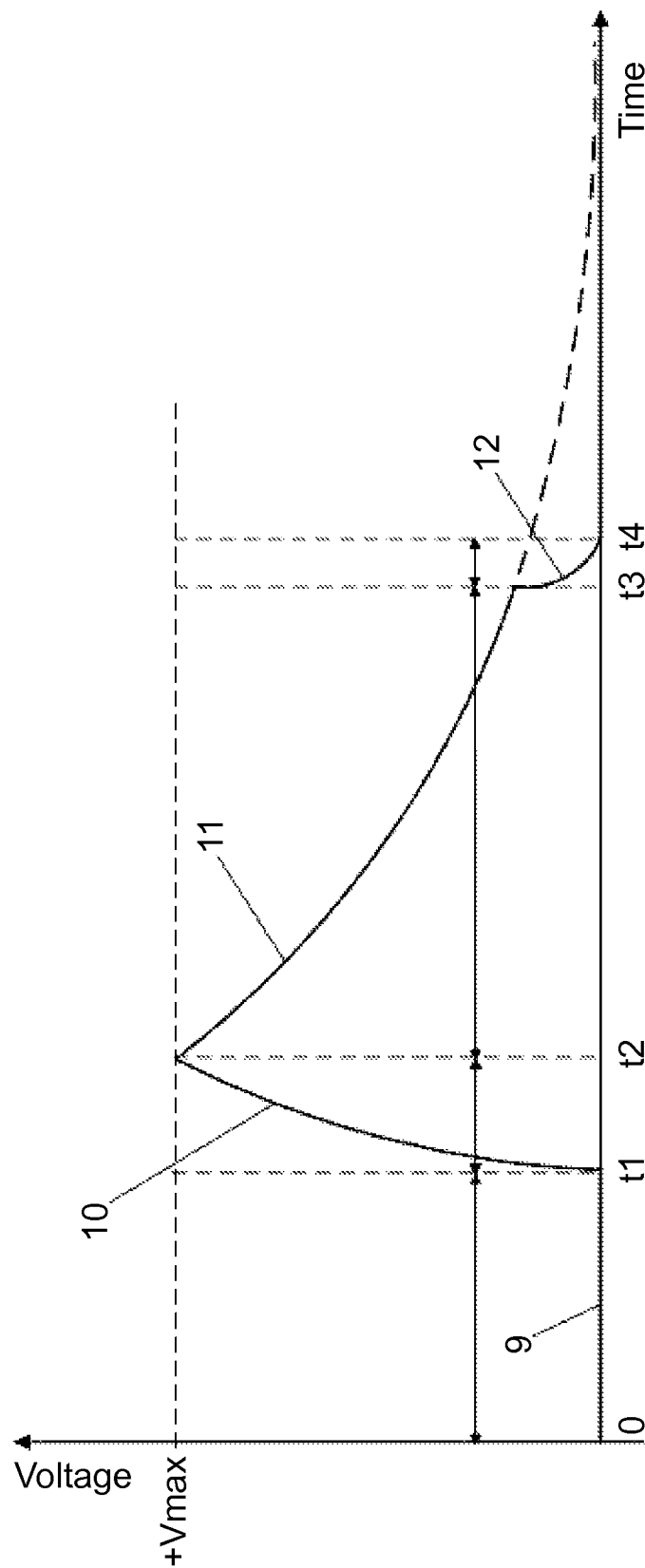
FIG. 2 is a graph of the idealized probe voltage for the equivalent circuit in FIG. 1.

FIG. 2 illustrates V2 before and after an ESD event. The initial conditions 9 are that the object is at voltage V, C2 4 is completely discharged, and C1 2 is charged approximately to the object voltage V. At time t1 SW1 5 closes, and the object 1 discharges in nano seconds and the object voltage V abruptly drops to zero. C1 2 is still at V, but its polarity is reversed, so that C1 2 and C2 4 are connected in parallel. C2 2 voltage increases and reaches its maximum value Vmax=−V*C1/(C1+C2) at time t2, during the charge redistribution phase 10. The sign of Vmax is opposite to the initial object potential V. So a negative charged object and ESD will result is a positive V2.

After t2 the resistor 7 discharges C2 4 exponentially, during discharge phase 11. During t2 to t3 Vmax is measured to estimate ESD voltage V. At t3 SW2 6 is closed by a microcontroller 56 of the detector in FIG. 8. This immediately discharges C4 4, during reset phase 12. The detector is ready to detect and measure the next ESD after t4.

The time from t1 to t2 (Δt1) is much smaller than τ=C2*R (the C2 4 discharge time constant). Thus resistor 7 does not significantly discharge C2 4 during Δt1.

Thus ESD measurement is based on the probe voltage change when an ESD event takes place. The resistor 7 (i.e. equivalent to the resistor 37 of FIG. 8) may separate slow and fast probe voltage variations. The switch 6 (i.e. equivalent to the switch 35 of FIG. 8) allows detection and measurement of multiple ESD events in very short time intervals.

Figure 3A:
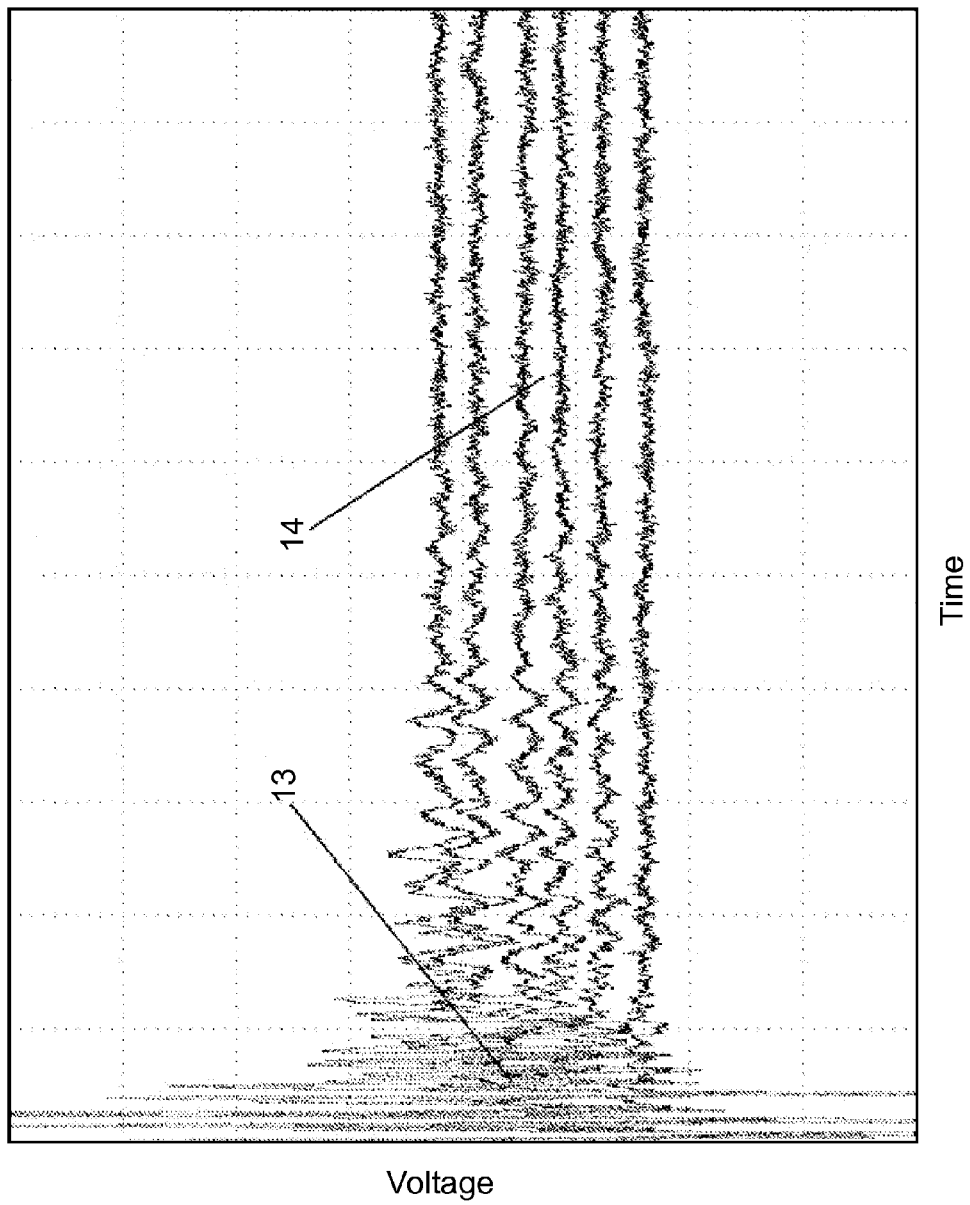
FIG. 3A is a graph of actual probe voltage for different ESD voltage values.
Figure 3B:
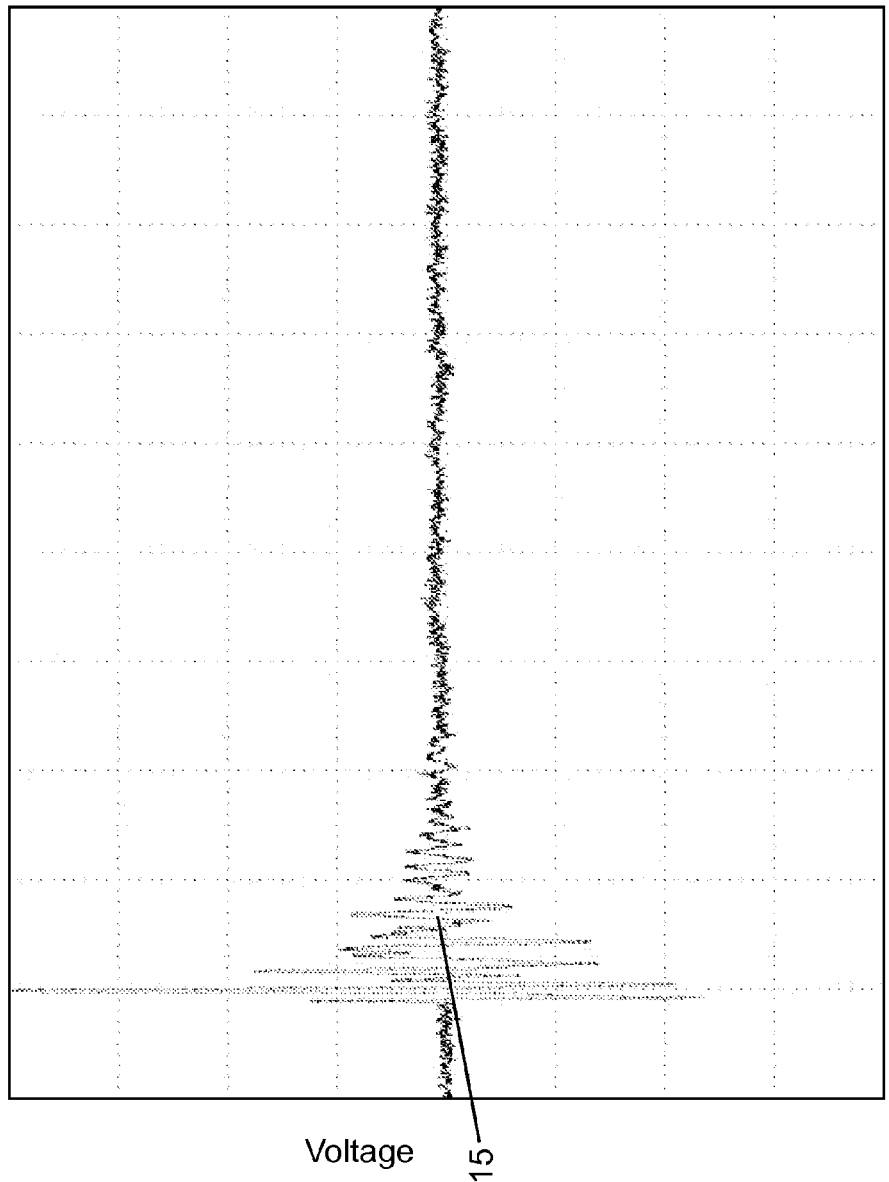
FIG. 3B is a graph of actual probe voltage for non-ESD event.

Actual probe voltages 13 with different initial object potentials from 200 to 1200 V are shown in FIG. 3A with an ESD event. The signal 15, created by non-ESD event, is shown in FIG. 3B. In the case of an ESD event each of the signals 13 has a DC voltage component 14 and there is no DC voltage component in EMI signal 15. This DC voltage 14 is directly proportional to the initial object charge voltage V and its presence in the signal may be used to distinguish ESD and non-ESD.

Figure 4A:
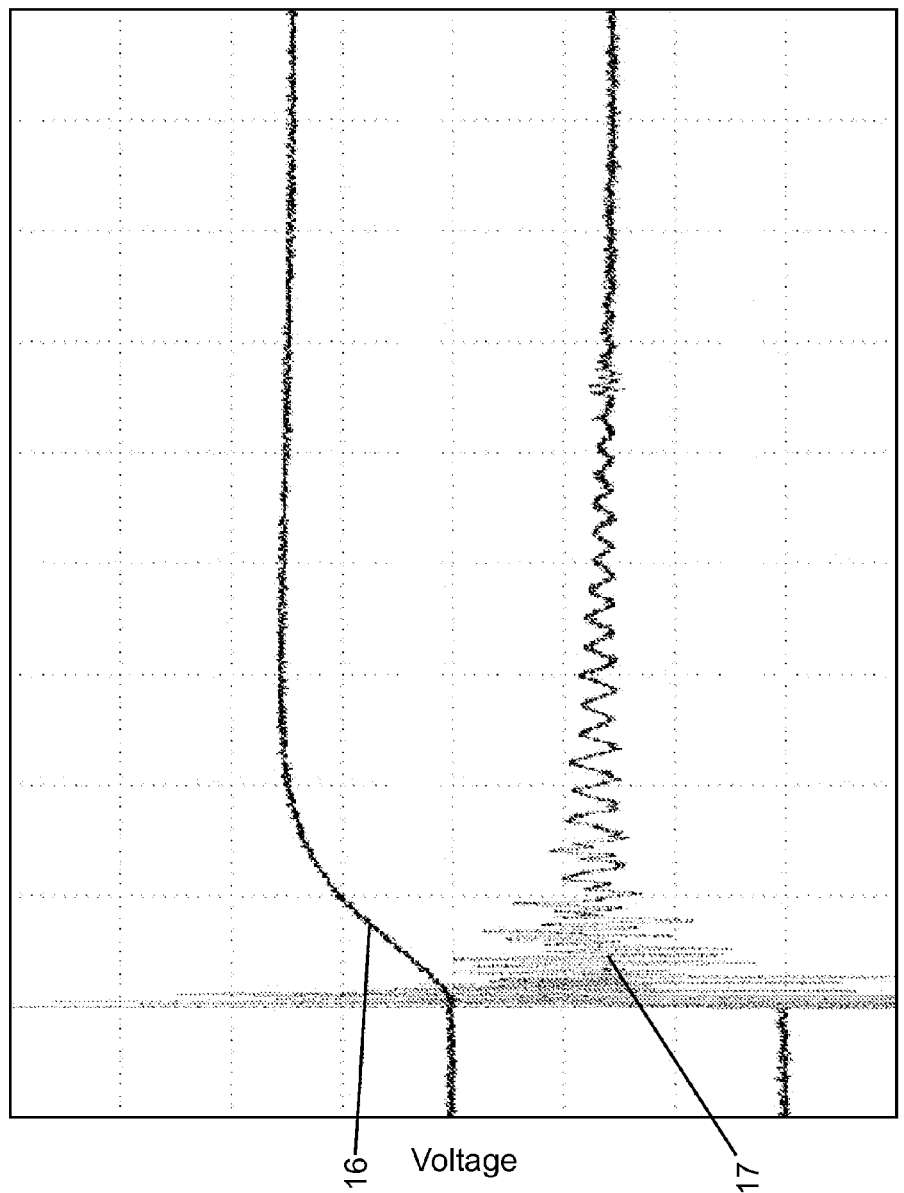
FIG. 4A is a graph of the actual probe voltage and low-pass filter output for an ESD event.
Figure 4B:
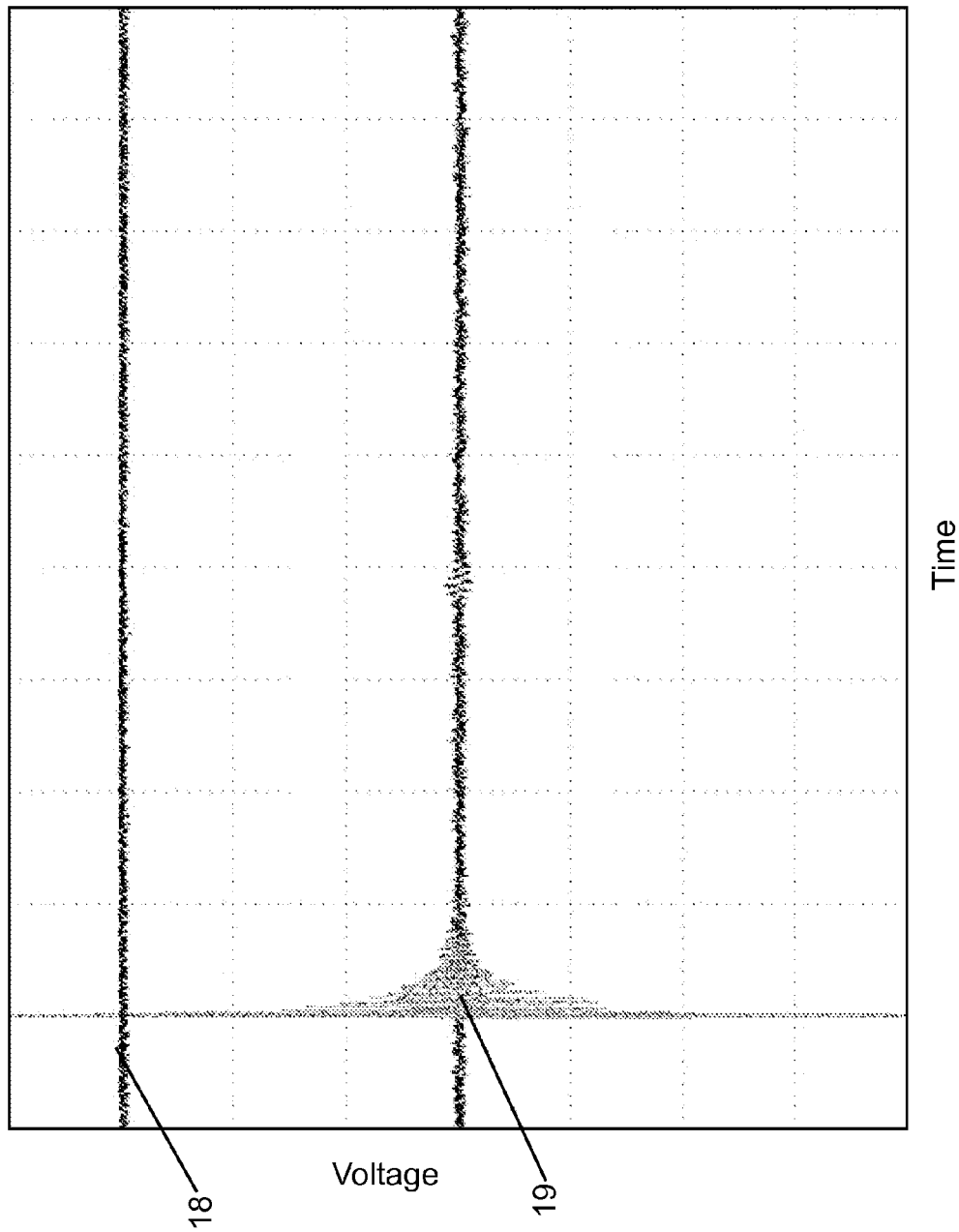
FIG. 4B is a graph of the actual probe voltage and low-pass filter output for a non-ESD event.

The DC voltage 14 may be measured and its RF influence filtered out. This may be achieved by passing the output probe voltage through the Low-Pass Filter 41. The voltage before and after the filtering, for both ESD and EMI, are shown in FIG. 4A and FIG. 4B correspondingly. FIG. 4A depicts the RF signal obtained when the ESD event occurs and since the time event is relatively short, a time scale of 500 nanoseconds for the oscilloscope was used. Furthermore, in this instance, a low-pass filter with a 10 μsec time constant. The measurements are taken based on the implemented circuit in FIG. 9. The probe voltage is annotated as Unit Gain Amplifier Raw Input in FIGS. 4A and 4B. As shown in FIG. 4B the Low-Pass Filter output voltage 18 in the case of input EMI 19 is equal to zero. For ESD after rejecting the RF component 17, the Low-Pass filter voltage increases for some maximum value and then starts to decrease slowly. The rise time of output signal is determined by the Low-Pass filter time constant. Preferably, a time constant of 10 μsec may be enough to reject high frequency signal spectral components induced by any ESD RF emission.

The detector shown in FIG. 8 is now described in more detail. The probe (antenna) 34 has an associated input capacitor 36. The switch 35 is controlled by the logical signal 59 from the microcontroller 56. The voltage 38 from the probe 34 is interfaced by a unit gain amplifier 39 to the Low-Pass filter 41, to match the high output antenna impedance to the low input impedance of the Low-Pass filter 41. The voltage 38 is accordingly output as voltage 40 which is then provided to the Low-Pass filter 41. The Low-Pass filter 41 is indirectly connected to the first Peak Voltage Detector 43 through an inverter 44 via a connection 42, which is assigned for positive polarity ESD events, and directly connected to the second Peak Voltage Detector 46 via a connection 45, which is assigned for negative polarity ESD events. The inverter 44 is connected to a differentiating amplifier 50. The output 51 of the differentiating amplifier 50 could be negative and positive depending on the ESD polarity and is respectively supplied to inverting amplifier 52 and non-inverting amplifier 53. Both the amplifiers 52, 53 have unit gain and their outputs 54 and 55 are respectively connected to the different interrupt inputs of the microcontroller 56 to distinguish between positive and negative ESD. The microcontroller 56 also provides a reset signal 48 for both Peak Voltage Detectors 43,46 and control signal 59 for switch 35. In addition, both the Peak Voltage Detectors 43, 46 respectively provide output signals 49, 47 to the microcontroller 56 representing the amplitude of a positive or negative ESD event respectively. Using a SPI interface 57, the microcontroller 56 manages a wireless data transmission unit 58 for continuous ESD monitoring.

Figure 5A:
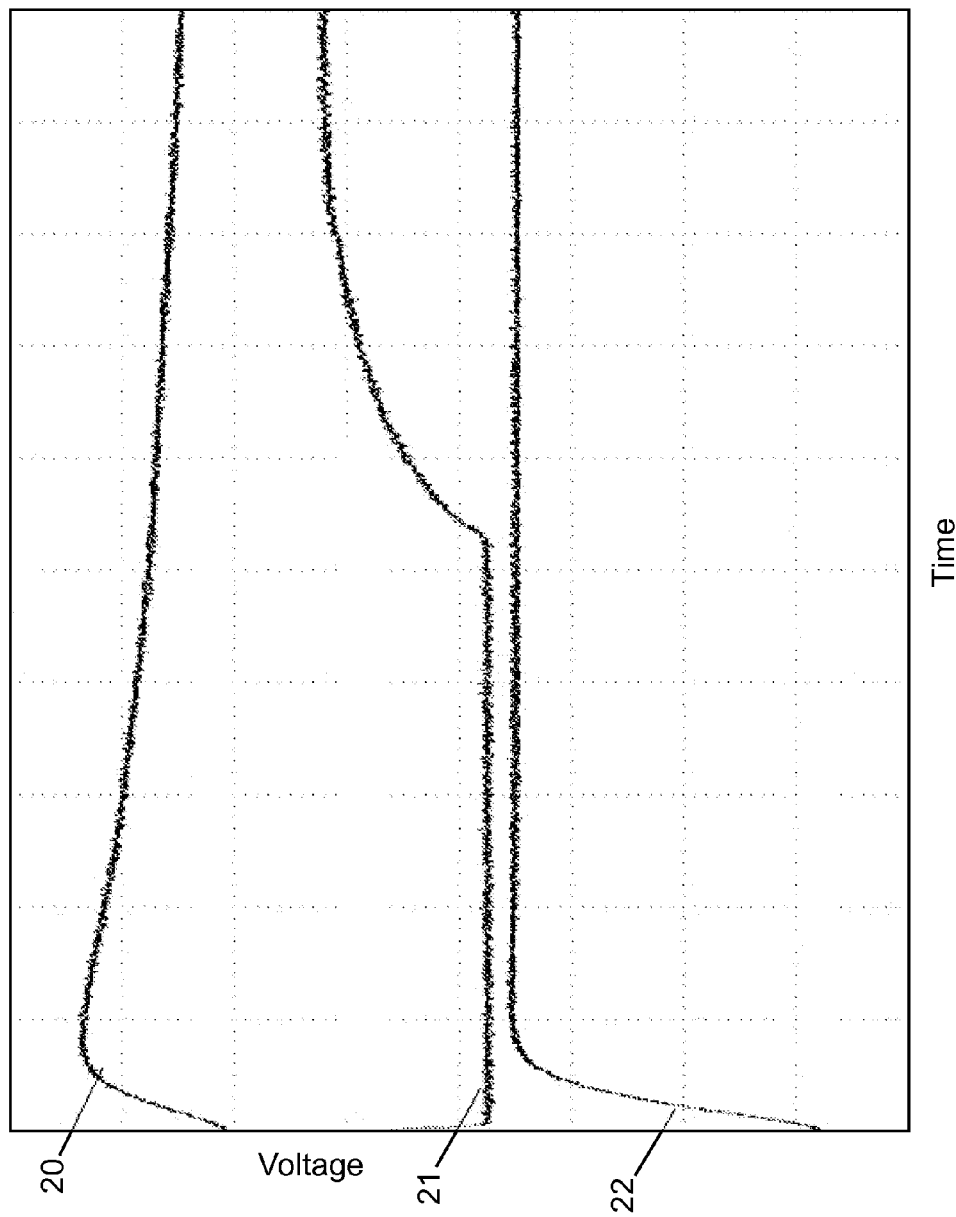
FIG. 5A is a graph of the actual low-pass filter, differentiating amplifier and peak detector outputs for a negative ESD event without discharge path switching from the microcontroller.

FIG. 5A shows the differentiating amplifier output 21, and the output from the Low-Pass Filter 20. The dotted lines represent the theoretical response, when the differentiating amplifier is powered from an unlimited value voltage source. For the actual −5V negative supply voltage output of differentiating amplifier 21 is limited on negative (positive for opposite sign ESD) power supply level. This signal will be used to interrupt the microcontroller 56 when it changes from 0 to −5V. The Peak Hold Detector output 22 is also shown.

Figure 5B:
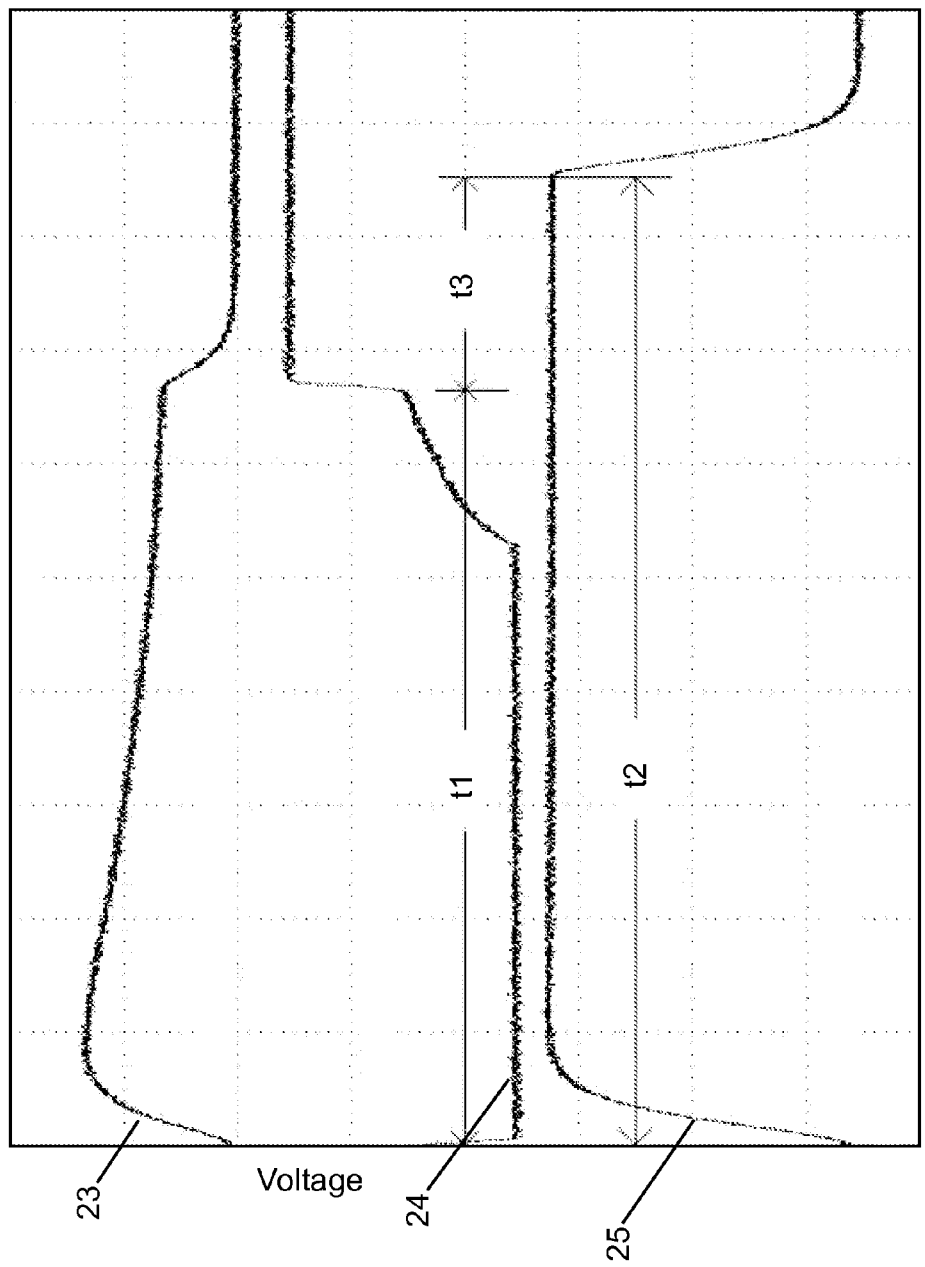
FIG. 5B is a graph of the actual low-pass filter, differentiating amplifier and peak detector outputs for a negative ESD event with discharge path switching from the microcontroller.

The sequence of ESD detection and measurement by the microcontroller 56 for negative object charge V is shown in FIG. 5B. When an ESD event causes the Low-Pass Filter output voltage 23 to increase, the differentiating amplifier output 21 generates an interrupt signal 24 for the microcontroller 56. The microcontroller 56 resets Peak Value Detector 25, waits some time interval t1 to ensure that Low-Pass Filter output voltage reached its maximum and closes the switch 35 for capacitor 36 discharges. This delay may be for example 2 times the LPF time constant. In time interval t3 the measurement of Peak Detector output voltage is provided by the microcontroller 56 and then the microcontroller 56 resets the Peak Value Detector 25 again.

Figure 6:
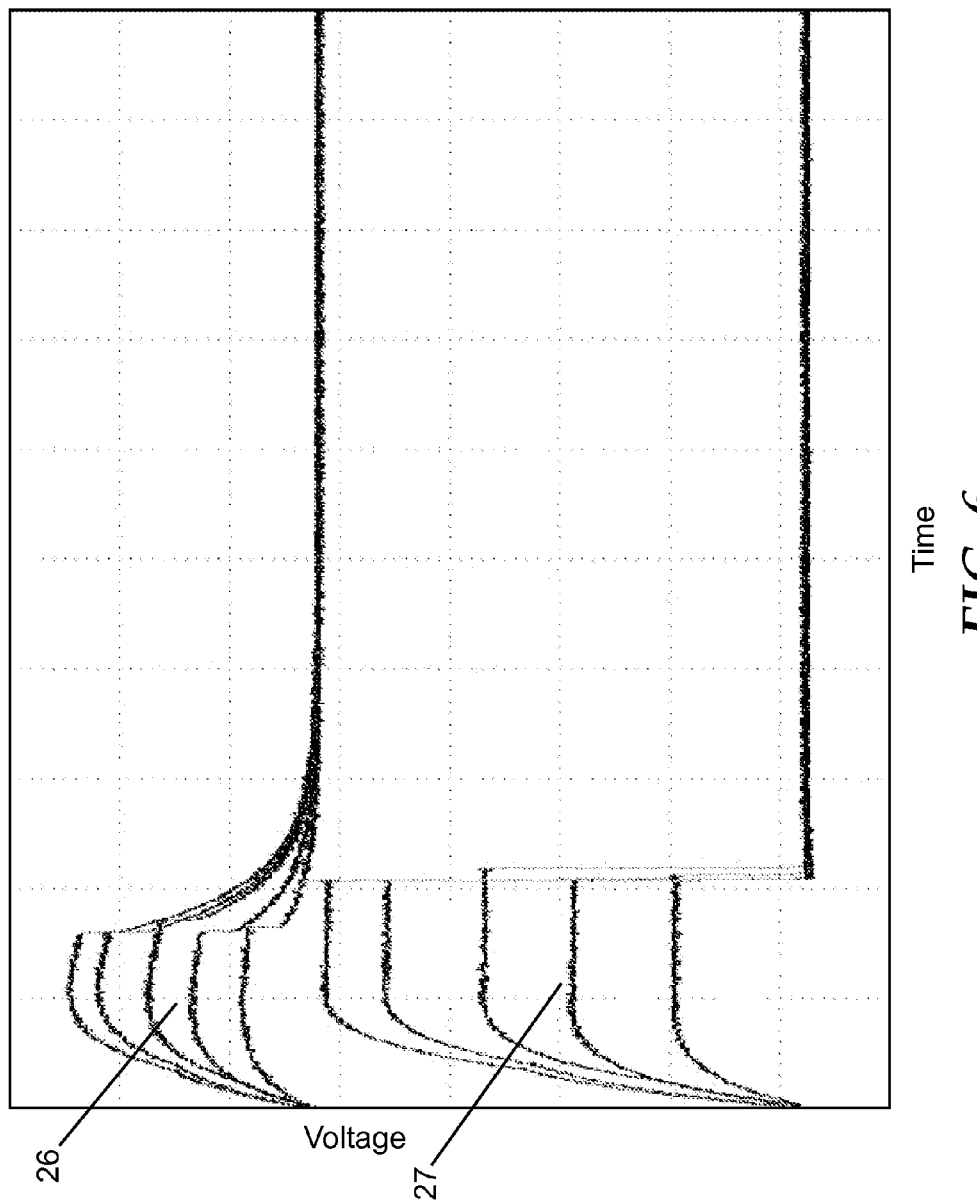
FIG. 6 is a graph of the actual low-pass filter and peak detector outputs for negative ESD events for different values of discharge voltage.

In FIG. 6 the output voltages for Low-Pass filter 26 and Peak Detector 27 are provided for discharge voltage values from 400V to 1100V.

Figure 7A:
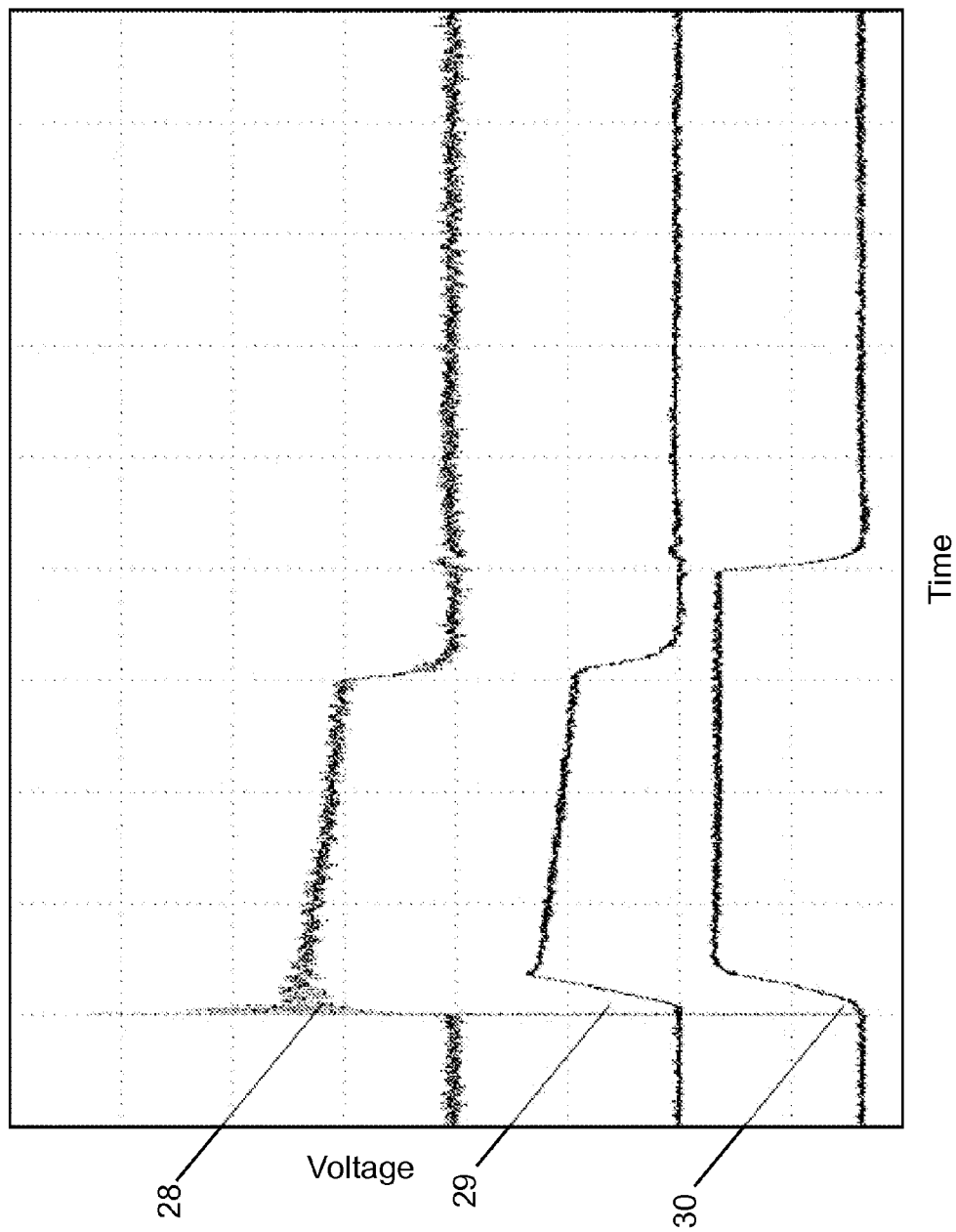
FIG. 7A is a graph of actual probe voltage, low-pass filter and peak detector outputs for a single ESD event.

The processing speed for single ESD event measurement is shown in FIG. 7A. The input probe voltage 28, the output of Low-Pass Filter 29 and Peak Value Detector output 30 shows it takes little more then 20 μsec for detection and measurement of an ESD event. This time might be further decreased by using a faster microcontroller.

Figure 7B:
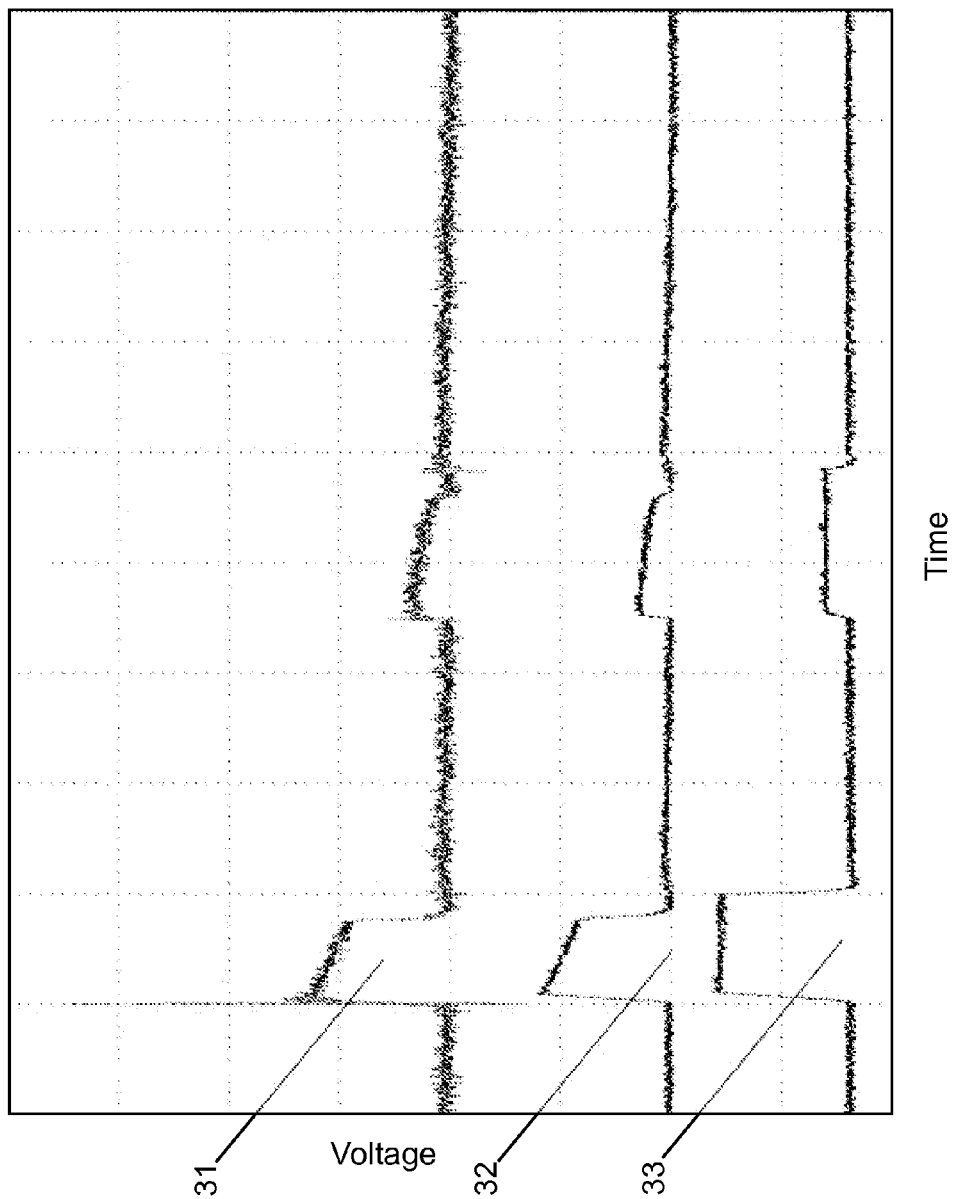
FIG. 7B is a graph of actual probe voltage, low-pass filter and peak detector outputs for multiple ESD events.

FIG. 7B shows multiple ESD event detection and measurement. The probe 31, Low-Pass Filter 32 and Peak Value Detector output 33 voltages showed that 70 μsec was the shortest time between two ESD events that were detected when the experiment in this instance was performed.

Figure 9:
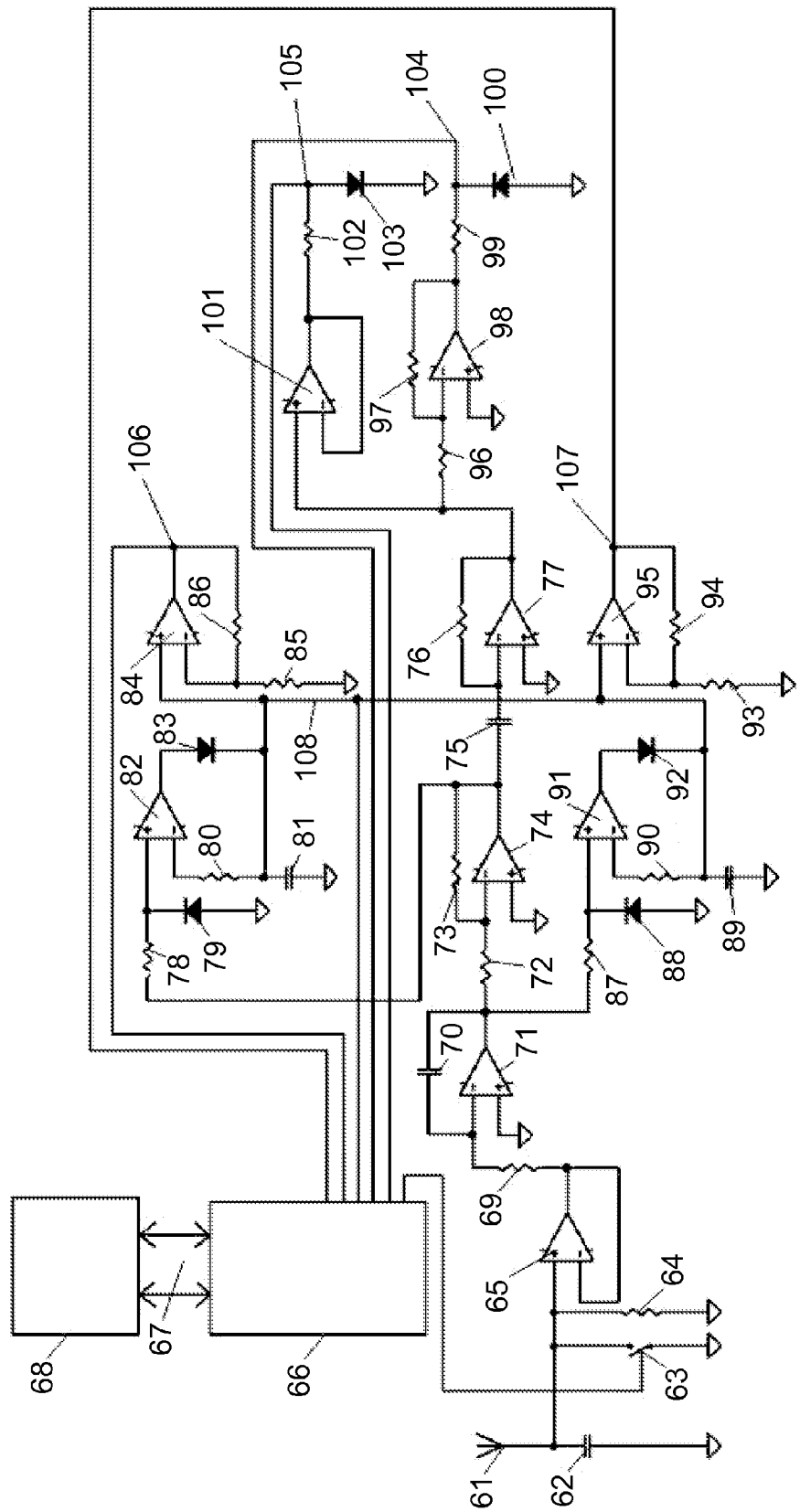
FIG. 9 is a circuit diagram of the ESD measurement and monitoring device in FIG. 8.

A particular circuit implementation of the device in FIG. 8 is shown in FIG. 9. As mentioned earlier an ESD event results in a voltage pulse on probe 61, capacitor 62, resistor 64 and normally opened switch 63. A unit gain amplifier 65 matches the probe 61 output impedance to the input of a first order analog Low-Pass Filter, implemented with a resistor 69, capacitor 70 and operational amplifier (OPAMP) 71. The OPAMP 71 is connected to a unit gain inverting amplifier implemented with resistors 72, 73 and operational amplifier (OPAMP) 74. This in turn connects to the input of a differentiating amplifier implemented with capacitor 75, resistor 76 and operational amplifier (OPAMP) 77.

The output of the OPAMP 77 is shown as voltage 21 in FIG. 5A and voltage 24 in FIG. 5B. The values of capacitor 75 and resistor 76 determine the derivative gain, which is chosen to saturate OPAMP 77 immediately when an ESD event occurs to provide an interrupt to wake up a microcontroller 66. The microcontroller 66 is connected, through wired Serial Peripheral Interface (SPI) connections 67, to a wireless data transmission unit 68 (which is similar to the wireless data transmission unit 58 of FIG. 8) for continuous ESD monitoring. It will be further appreciated that the value of the differentiating amplifier output 21 is chosen based on the capacitor 75 and resistor 76 and the interrupt signal 24 which are observable from FIGS. 5A and 5B respectively. Once the probe charge has substantially dissipated, the differential amplifier is unsaturated and the capacitor 75 then starts charging from the power supply rail, which when fully charged causes the saturation of the output voltage. When switch 63 is closed, the differentiating amplifier saturates again at the opposite supply rail.

The OPAMP 77 is connected to the input of the second unit gain inverting amplifier, including resistors 96, 97, and operational amplifier (OPAMP) 98. The OPAMP 98 is connected to the microcontroller interrupt input 104 through the diode limiter of resistor 99 and diode 100. The purpose of diode limiter 100 is to block negative voltage components (which after inversion relate to positive components of the differentiating amplifier output) from the microcontroller interrupt input. Thus a negative ESD event causes a positive voltage pulse on interrupt input 104 of the microcontroller 66.

When an ESD event is positive it creates a positive pulse on the differentiating amplifier output, which passes through non-inverting second unit gain operational amplifier 101 and second diode limiter (resistor 102 and diode 103) to microcontroller interrupt input 105. The purpose of diode limiter 103 is to block negative voltage components (which relate to negative components of the differentiating amplifier output) from the microcontroller interrupt input. Thus a positive ESD event causes a positive voltage pulse on interrupt input 105 of the microcontroller 66. Interrupts 104 and 105 thus register negative and positive ESD events respectively to wake up the microcontroller 66 and to indicate when to reset the peak voltage detectors.

It will also be apparent from FIG. 9 that the positive ESD the inputs of operational amplifiers (OPAMP) 82,84 are connected to the output of operational amplifier (OPAMP) 74, and for negative ESD, the inputs of operational amplifiers (OPAMP) 91,95 are connected to the output of OPAMP 71.

The peak detectors are provided to measure the amplitude of the ESD event. In the case of positive ESD event the positive pulse from operational amplifier 74 a voltage limiter (resistor 78 and diode 79) to the input of the first Peak Value Detector. This detector includes the operational amplifiers (OPAMP) 82 and 84, diode 83, resistors 80, 85, 86 and capacitor 81. OPAMP 84 is connected to the ADC (Analog to Digital Converter) input 106 of the microcontroller 66.

Similarly in the case of negative ESD the positive pulse from the output of Low-Pass Filter comes through the diode limiter (comprising resistor 87 and diode 88) to the second Peak-Value Detector (comprising operational amplifiers 91 and 95, diode 92, resistors 90, 93, 94 and capacitor 89). The output of the second Peak Value Detector is connected to the ADC input 107 of the microcontroller 66.

The microcontroller 66 resets both the Peak Value Detectors from its digital output 108 after the A/D conversion is done and measurement completed, which is determinable from the status of the setup-conversion-ready bit stored in an A/D status register of the microcontroller 66.

Figure 10:
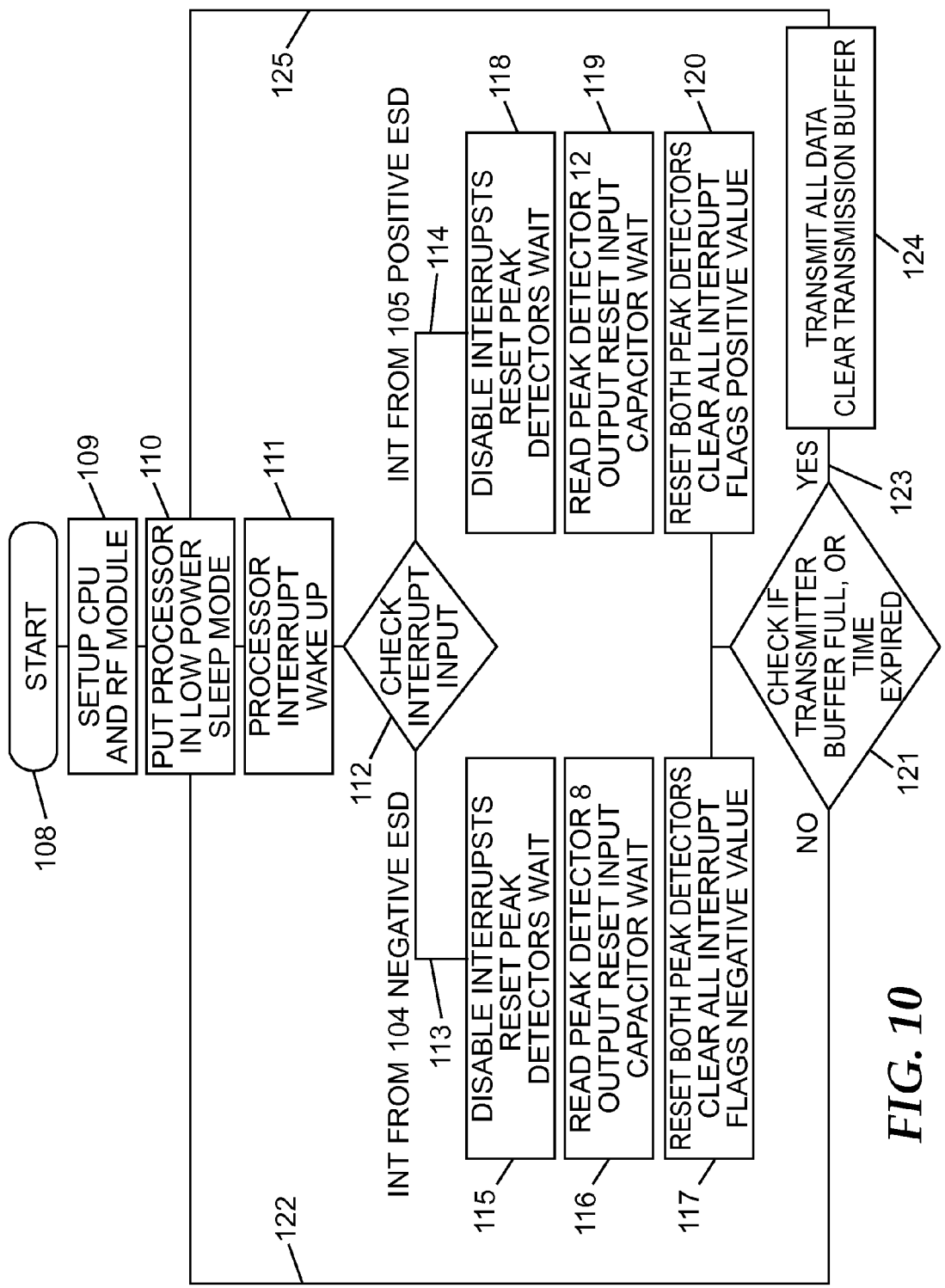
FIG. 10 is a flow chart of a microcontroller algorithm for the ESD measurement and monitoring device in FIG. 8.

The microcontroller firmware algorithm is shown in FIG. 10. The device is powered on and the microcontroller 66 started at 108. When all initial setup of electric circuit, microcontroller internal devices and pins are done at 109, the microcontroller 66 enters into the ultra-low power sleep mode at 110. During this sleep mode all analog circuitry are powered, but because there are no high frequency components and general purpose CMOS operation amplifiers are used, typically the power consumption is a of couple μA. For example Texas Instruments model MSP430 has a low power mode 4 which consumes less then 1 μA. Normally when not being entered into sleep mode, the only time the current is significantly higher is when a wireless RF module is energized for data transmission. Its value is about 200 μA.

When an ESD event happens, the microcontroller 66 wakes up at 111 and checks whether it is a positive or negative ESD event at 112. When ESD event is negative 113 the results are read from interrupt 107 and when it positive 114 the results are read from interrupt 106. First the microcontroller 66 disables all interrupts and resets both Peak Value Detectors at 115 (118) to remove any possible residual voltages on their outputs. The algorithm then waits for a delay to ensure that the Low-Pass Filter output voltage has reached its maximum. The delay time might be twice the Low-Pass Filter time constant. Then analog to digital conversion of the appropriate Peak Value Detector output occurs at 116 (119), followed by activating switch 63 to discharge the capacitance 62. A delay is provided to ensure that the probe has fully discharged. Then the Peak Value Detector outputs are reset, all interrupts flags are cleared and the measured data is stored in microcontroller RAM transfer buffer at 117 (120).

The device transmits measured data using the RF channel in two cases: when the transmission buffer is full because multiple ESD events or after some time the period has expired and there are no new ESD events but something is still in the buffer 121. If transmission is not required the microcontroller 66 could be returned directly into the low power sleep mode at 122. If not the RF module transmits all data and clears the transmission buffer 124 and returns to the sleep mode at 125.

The described embodiment should not be construed as limitative. For example, in FIGS. 8 and 9, the microcontroller 56/66 is used to control the various operations but it should be appreciated in general a processor may be used which may include the microcontroller 55/56, an embedded controller and microprocessor or any suitable forms of processors.

Having now fully described the invention, it should be apparent to one of ordinary skill in the art that many modifications can be made hereto without departing from the scope as claimed.

The invention claimed is:

1. A device for detecting an electrostatic discharge event by an object, the device comprising:
   a receiver for forming a first capacitive coupling with the object and a second capacitive coupling with a ground;
   a first discharge path for discharging the second capacitive coupling to the ground, such that an electrostatic discharge event by the object charges the second capacitive coupling by an amount in a first time interval $\Delta t1$ that is substantially less than a second time interval $\Delta t2$ that it takes for the second capacitive coupling to discharge by the same amount through the first discharge path; and
   a second discharge path for discharging the second capacitive coupling to the ground, the device adapted to choose between the first and second discharge paths.

2. The device of claim 1, wherein $\Delta t1$ is less than $\Delta t2$ by at least a factor of 10.

3. The device of claim 1, wherein $\Delta t1$ is less than $\Delta t2$ by at least a factor of 100.

4. The device of claim 1, wherein a discharge time through the second path is substantially less than a discharge time through the first path.

5. The device according to claim 1, further comprising a commutation device for switching between the first and second discharge paths.

6. The device according to claim 5, further comprising a processor for controlling the switching of the commutation device.

7. The device according to claim 6, further comprising a low pass filter for blocking radio frequency signals of the output voltage signal to produce a filtered voltage signal.

8. The device according to claim 7, further comprising an amplifier arranged to match an output impedance of the receiver to an input impedance of the low pass filter.

9. The device according to claim 8, further comprising a peak detection circuit for outputting a peak voltage of the filtered voltage signal, the magnitude of the ESD event being determined based on the peak voltage.

10. The device according to claim 9, wherein the processor is arranged to switch from the first discharge path to the second discharge path after obtaining the peak voltage from the peak detection circuit.

11. The device according to claim 10, wherein the processor is arranged to reset the peak detection circuit after obtaining the peak voltage.

12. The device according to claim 9, wherein the peak detection circuit includes a positive peak detector and a negative peak detector.

13. The device according to claim 12, further comprising an inverter for producing an inverted output signal of the filtered voltage signal, and wherein the inverted output signal is received by the negative peak detector.

14. The device according to claim 13, further comprising a pulse generation circuitry arranged to produce a triggering pulse based on the inverted output signal.

15. The device according to claim 14, wherein the processor is operable between a low power standby mode and an active mode, and wherein the processor is arranged to switch from the low power standby mode to the active mode upon detection of the triggering pulse.

16. The device according to claim 14, wherein the pulse generation circuitry includes an inverting differentiating amplifier for producing an amplified output signal which is proportional to a first derivative of the inverted output signal, the triggering pulse being generated based on the amplified output signal.

17. The device according to claim 1, wherein the primary discharge path includes a resistor and the output voltage signal is arranged to discharge through the resistor.

18. A method of detecting an electrostatic discharge event by an object, the method comprising:
   forming a first capacitive coupling between a receiver and the object, the receiver also forming a second capacitive coupling with a ground;
   charging the second capacitive coupling by an amount in a first time interval $\Delta t1$ due to an electrostatic discharge event by the object;

discharging the second capacitive coupling by the same amount in a second time interval Δt2 via a first discharge path to the ground, wherein the first time interval Δt1 is substantially less than the time interval Δt2; and switching between the first discharge path and a second discharge path for discharging the second capacitive coupling to the ground.

19. The method of claim 18, wherein a discharge time through the second discharge path is substantially less than a discharge time through the first discharge path.

20. The method according to claim 18, further comprising controlling the switching from the first discharge path to the second discharge path by a processor.

21. The method according to claim 20, further comprising filtering the output voltage signal to block radio frequency signals of the output voltage signal to produce a filtered voltage signal.

22. The method according to claim 21, further comprising detecting a peak of the filtered voltage signal by a peak detection circuit, outputting a peak voltage of the filtered voltage signal, and determining the magnitude of the ESD event based on the peak voltage.

23. The method according to claim 22, further comprising resetting the peak detection circuit after determining the magnitude of the ESD event.

24. The method according to claim 22, wherein detecting the peak of the filtered voltage signal includes detecting a positive peak or a negative peak of the filtered voltage signal.

25. The method according to claim 22, further comprising inverting the filtered voltage signal to produce an inverted output signal, and detecting the peak of the filtered voltage signal includes detecting a negative peak of the inverted output signal.

26. The method according to claim 25, further comprising generating a triggering pulse based on the inverted output signal.

27. The method according to claim 26, wherein the processor is operable between a low power standby mode and an active mode, and the method comprises switching the processor from the low power standby mode to the active mode upon detection of the triggering pulse.

28. The method according to claim 27, further comprising producing an amplified output signal which is proportional to a first derivative of the inverted output signal, and generating the triggering pulse based on the amplified output signal.

29. An electrostatic discharge (ESD) event detector comprising a receiver for receiving electromagnetic emission generated by an object and for forming a first capacitive coupling with the object;

a second capacitive coupling between the receiver and ground for creating a capacitive divider with the first capacitive coupling, the capacitive divider arranged to produce an output voltage signal across the second capacitive coupling as a function of a charge voltage of the electromagnetic emission, the output voltage signal being used to determine a magnitude of the ESD event;

a first discharge path arranged in parallel electrically with the second capacitive coupling to enable the second capacitive coupling to discharge; and a commutation device for selectively switching between the first discharge path and a second discharge path which allows the second capacitive coupling to discharge faster than via the primary discharge path.

30. A method of detecting an electrostatic discharge (ESD) event, the method comprising (i) receiving electromagnetic emission from an object by a receiver, the receiver forming a first capacitive coupling with the object;

(ii) obtaining an output voltage signal across a second capacitive coupling as a function of a charge voltage of the electromagnetic emission, the second capacitive coupling creating a capacitive divider with the first capacitive coupling, (iii) determining a magnitude of the ESD event based on the output voltage signal;

(iv) discharging the second capacitive coupling through a first discharge path arranged in parallel electrically with the second capacitive coupling; and (v) upon determining the magnitude, switching from the first discharge path to a second discharge path to allow the second capacitive coupling to discharge faster than via the primary discharge path.

* * * * *